United States Patent
Neppl

[11] Patent Number: 5,597,766
[45] Date of Patent: Jan. 28, 1997

[54] METHOD FOR DETACHING CHIPS FROM A WAFER

[75] Inventor: Franz Neppl, Ottobrunn, Germany

[73] Assignee: Siemens Aktiengesellschaft, Munich, Germany

[21] Appl. No.: 246,768

[22] Filed: May 20, 1994

[30] Foreign Application Priority Data

May 27, 1993 [DE] Germany .......................... 43 17 721.2

[51] Int. Cl.⁶ ................................................. H01L 21/301
[52] U.S. Cl. ...................... 437/226; 437/21; 437/227; 437/231; 148/DIG. 28; 148/DIG. 50; 148/DIG. 135
[58] Field of Search ..................................... 437/231, 226, 437/227, 474, 21; 148/DIG. 28, DIG. 50, DIG. 135, DIG. 145, DIG. 150

[56] References Cited

U.S. PATENT DOCUMENTS

| | | | |
|---|---|---|---|
| 4,104,786 | 8/1978 | Boah et al. | 437/227 |
| 4,978,639 | 12/1990 | Hua et al. | 437/226 |
| 5,057,450 | 10/1991 | Bronner et al. | 148/DIG. 135 |
| 5,064,771 | 11/1991 | Solomon | 148/DIG. 135 |
| 5,071,792 | 12/1991 | Van Vonno et al. | 437/227 |
| 5,244,830 | 9/1993 | Kang et al. | 148/DIG. 149 |
| 5,270,265 | 12/1993 | Hemmenway et al. | 437/21 |

FOREIGN PATENT DOCUMENTS 4223356  8/1992  Japan ..................................... 437/226

*Primary Examiner*—Kevin M. Picardat
*Attorney, Agent, or Firm*—Hill, Steadman & Simpson

[57] ABSTRACT

Method for detaching chips in the silicon layer of a SOI substrate, wherein trenches are etched between the chips down to the insulating layer of the SOI substrate. Spacers for the passivation of SiO₂ layers of the chips are produced. Finally, the chips are detached by etching the insulating layer off.

10 Claims, 1 Drawing Sheet

METHOD FOR DETACHING CHIPS FROM A WAFER

BACKGROUND OF THE INVENTION

1. Field of the Invention

The present invention is directed generally to integrated circuit (IC) chips and more specifically to the detaching of IC chips from the wafer in which they were fabricated in common.

2. Description of the Prior Art

After the end of the manufacture of IC chips on a wafer, the complete wafers must be separated into these individual chips. To this end, the wafers are thinned, glued on carriers, sawed along what are referred to as saw frames with diamond saws, released from the carrier substrate and cleaned. The installations used for the IC fabrication cannot be used for these jobs. Rather, specific installations are required because of the incompatible method steps. The sawn edges that result are rough, and the method produces substantial densities of small particles that arise during sawing. These particles settle on the chips and can be a hinderance in the further use of the chips, for example in large scale integration (LSI) microsystems such as multichip memories (MCMs).

SUMMARY OF THE INVENTION

It is an object of the present invention to provide a simplified method for detaching chips from a wafer which, in particular, can be implemented in a simple way for silicon wafers using the standard installations of IC fabrication silicon process technology.

The present invention provides a method for detaching chips produced in a silicon layer of an SOI substrate wafer from the wafer, having the steps of etching trenches between the chips proceeding from a side of the wafer having the chips to remove material that carries the chips, the trenches extending down to an insulating layer of the SOI substrate, and selectively etching the insulating layer, thereby removing same to detach the chips from one another.

In the method of the invention, trenches are etched between the individual chips. After regions at the surface of the chip have been potentially passivated, the material that carries the chips is removed, i.e., etched off. The individual chips thereby become free.

The advantages of this method are that the trench etching can occur within the framework of the standard technology. The production of the disturbing particles is eliminated, and the edges of the chips become smooth, even rounded under certain circumstances. An ideal point of departure for the further processing of the chips results therefrom, for example given cubic integration technique.

Any desired chip shapes are possible, even circular areas. Any desired combinations of chips are also possible, even given the tightest packing thereof on a wafer, since restrictions due to straight-line, continuous saw lines are eliminated in the present invention.

The parting regions between the chips can be kept extremely small in the method of the invention because the parting trenches can be etched extremely narrow. Substantially broader parting edges of, typically, 100 μm are required for sawing the chips, whereas the trenches can be etched in a width of 2–5 μm. A substantial reduction of the space required on the wafer thus results because a larger proportion of the area can be used for the chips and the intermediate regions are much narrower. This positive effect is especially pronounced with small ICs such as, for example, HF bipolar chips.

The method of the invention can be especially advantageously utilized when using silicon on insulator (SOI) substrates. The chips are manufactured in the silicon layer of a SOI substrate. The trenches that separate the individual chips from one another are etched in this silicon layer down to the insulating layer of the SOI substrate. The insulating layer can be etched off then from above through these trenches. $SiO_2$ regions potentially uncovered by the trenches that form parts of the chips can be suitably passivated before etching the insulating layer off. The insulating layer being usually likewise composed of $SiO_2$.

An arrangement of the chips on a SOI substrate with the etched trenches is shown in the figures described below. A critical point in realizing the method of the invention is a deep trench etching at the edges of the chips. Given widths of 2–5 μm, depths of trenches of approximately 40 μm are thereby possible. This depth of the trenches roughly corresponds to the desired thickness of the chips. The trenches can be temporarily filled with an auxiliary layer, for example, for stabilizing the wafer during an additional step for thinning the substrate. This auxiliary layer is then removed later.

A detailed description of the method of the invention with reference to the figures follows.

DETAILED DESCRIPTION OF THE PREFERRED EMBODIMENTS

Figure 1:
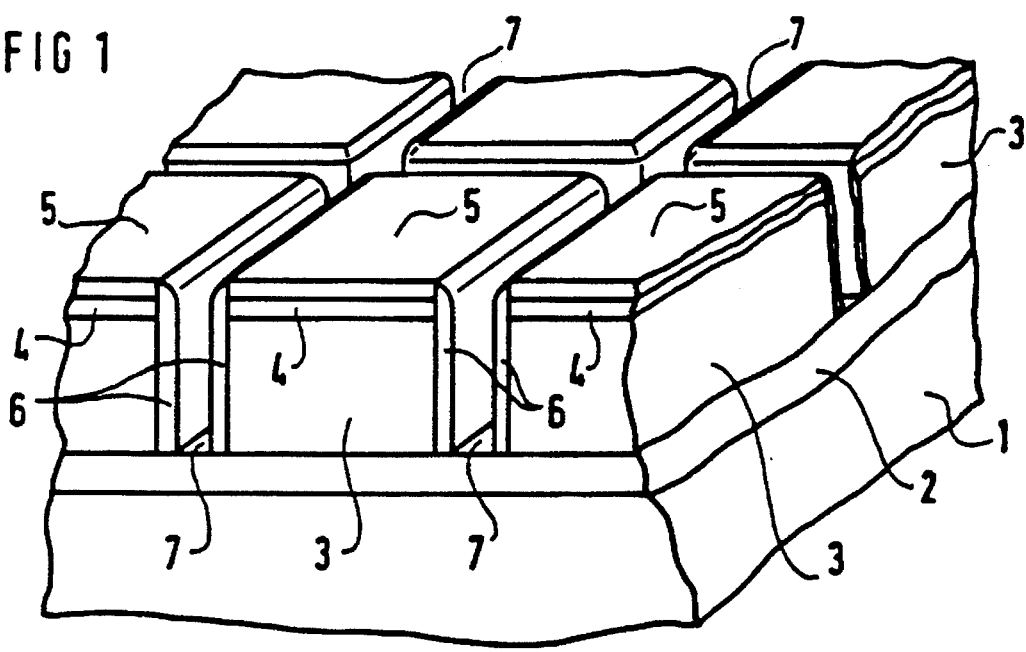
FIG. 1 illustrates an arrangement of chips on an SOI substrate of the present invention.

On an SOI substrate 1, FIG. 1 shows chips 3 produced in the silicon layer located on the insulating layer 2. These chips are to be separated from one another, i.e. to be detached from one another. The thickness of the chips roughly corresponds to the original thickness of the silicon layer of the SOI substrate. What is to be understood here and, in particular, in the claims by SOI substrate is a substrate wherein a thin silicon layer is applied onto an insulating layer. Such SOI substrates can also be manufactured by SIMOX or wafer bonding. The insulating layer 2 is usually $SiO_2$.

As an example, respective $SiO_2$ layers 4 are entered in the chips 3 in an embodiment illustrated in FIG. 1. These $SiO_2$ layers are covered toward the surface by passivation layers 5. After the trenches 7 for separating the chips have been etched down to the insulating layer 2, spacers 6 are produced at the sides of the chips 3. These spacers 6 protect the $SiO_2$ layer 4 toward the outside. In an embodiment, these spacers 6 are SiN. These spacers 6, for example, are applied in the standard way in that, first, the SiN is isotropically applied surface-wide and is then subsequently etched back anisotropically. This additional passivation layer 5 can also be omitted when no $SiO_2$ regions in the chips 3 are exposed. This passivation layer 5 can likewise already be manufactured in the standard process for the manufacture of the ICs. For example, the $SiO_2$ regions in the chips are locally limited and are laterally surrounded by SiN or similar material. Proceeding on the basis of the structure shown in FIG. 1, the material of the insulating layer 2 is etched through the trenches 7. Given an isotropic etching, the material of the insulating layer 2 (for example, $SiO_2$) under the chips 3, i.e. between the chips 3 and the remaining substrate 1, is eliminated. The chips 3 are thereby detached from one another.

Figure 2:
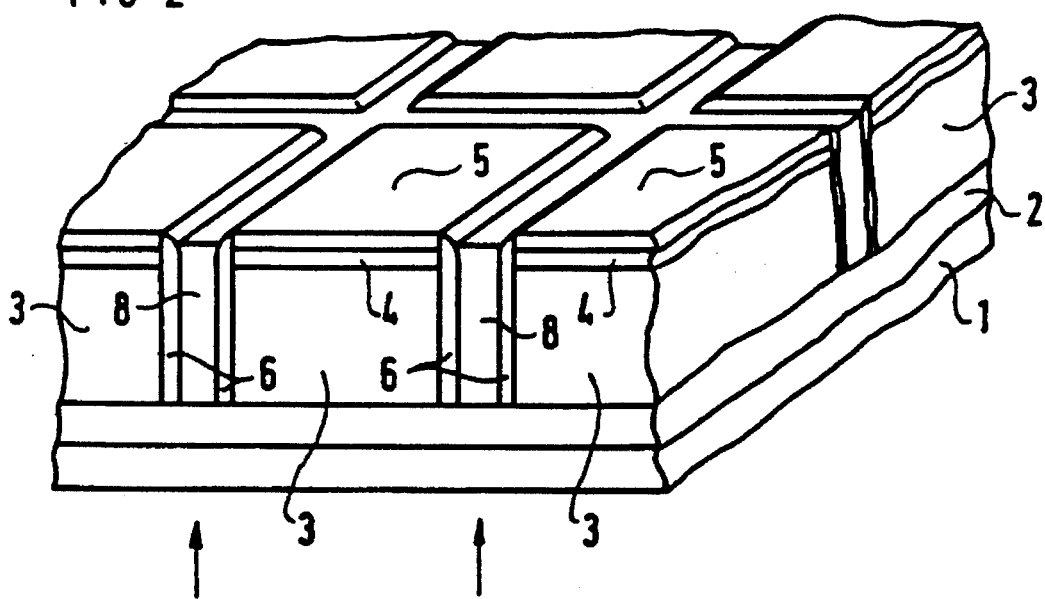
FIG. 2 illustrates an arrangement of chips on an SOI substrate of the present invention with the etched trenches filled with a filler.

An alternative embodiment of the method of the invention provides that the material of the wafer be removed, for example by grinding or etching proceeding from the backside. This removal is performed after the etching of the trenches until the trenches are uncovered and the chips are thereby detached from one another. In this process, the wafer is thinned until only the individual chips remain. In order to stabilize the wafer during this thinning, a filler can be introduced into the trenches that have been etched out. The filler is then removed at the end by etching. This version of the embodiment is shown in FIG. 2.

Specifically, the wafer of FIG. 2 is again an SOI substrate having an insulating layer 2 on a single-crystal silicon body 1. The erosion of the material of this silicon body 1 proceeding from the backside is indicated by the arrows. In this exemplar embodiment, the etched-out trenches were filled with a filler 8 for stabilization before the wafer is etched thinner. The SOI substrate is removed at least down to the insulating 2. The insulating layer 2 can either be etched off or ground off or it is removed together with the filler 8 by a surface-wide etching attack. This filler 8 is advantageously of the same material as the insulating layer 2, for example $SiO_2$. The filler 8 can be separated from the chips by previously applied spacers 6 for passivation of SiN or of polysilicon.

When the filler 8 is omitted, the chips 3 are detached from one another as soon as the material carrying the chips (the insulating layer 2 in this example) has been completely eroded. This is likewise true when using traditional substrates 1 without the insulating layer arranged between the chips 3 and the substrate 1. The process of thinning the wafer is then continued with or without filler 8 in the trenches until the chips are reached.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

I claim:

1. Method for detaching chips produced in a silicon layer of an SOI substrate wafer from said wafer, comprising the steps of:

etching trenches between said chips proceeding from a side of said wafer on which said chips are disposed to remove material that carries said chips, said trenches extending down to an insulating layer of said SOI substrate; and selectively etching said insulating layer, thereby removing same to detach said chips from one another.

2. Method according to claim 1, further comprising the step of covering uncovered surfaces of said chips with a passivation layer so that said insulating layer can be selectively etched and such that said trenches are not filled with said passivation layer.

3. Method according to claim 2, wherein said step of covering the uncovered surfaces of said chips with a passivation layer is further defined by providing SiN for said passivation layer.

4. Method according to claims 1, further comprising the steps of:

filling said trenches with the same material as said insulating layer before selectively etching said insulating layer; and removing said SOI substrate down to said insulating layer at the side of said insulating layer facing away from said chips.

5. Method according to claim 4, wherein said step of filling said trenches with the same material as said insulating layer before selectively etching said insulating layer is further defined by filling said trenches with $SiO_2$.

6. Method according to claim 1, further comprising the step of removing said material carrying said chips to thin said wafer from a side lying opposite said chips to uncover said trenches from said side lying opposite said chips.

7. Method according to claim 6, further comprising the steps of:

filling said etched trenches with filler;

thinning said wafer; and removing said filler.

8. Method according to claim 7, wherein said step of filling said etched trenches with filler is further defined by filling said trenches with $SiO_2$.

9. Method according to claim 7, wherein said step of thinning said wafer is further defined by thinning said wafer by thin-grinding.

10. Method according to claim 1, further comprising the step of thinning said wafer by thin-grinding.

* * * * *